United States Patent
Kwon et al.

(10) Patent No.: US 12,058,894 B2
(45) Date of Patent: Aug. 6, 2024

(54) DISPLAY DEVICE AND METHOD OF MANUFACTURING THE SAME

(71) Applicant: SAMSUNG DISPLAY CO., LTD., Yongin-si (KR)

(72) Inventors: Oh June Kwon, Hwaseong-si (KR); Woo Yong Sung, Seoul (KR); Chan Ho Moon, Suwon-si (KR); Jung Han Seo, Hwaseong-si (KR); Sung Hoon Yang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 308 days.

(21) Appl. No.: 17/448,362

(22) Filed: Sep. 22, 2021

(65) Prior Publication Data

US 2022/0208900 A1 Jun. 30, 2022

(30) Foreign Application Priority Data

Dec. 30, 2020 (KR) ........................ 10-2020-0187105

(51) Int. Cl.
| | | |
|---|---|---|
| H01L 27/32 | (2006.01) | |
| H01L 51/52 | (2006.01) | |
| H01L 51/56 | (2006.01) | |
| H10K 50/844 | (2023.01) | |
| H10K 59/122 | (2023.01) | |
| H10K 71/00 | (2023.01) | |

(Continued)

(52) U.S. Cl.
CPC ......... *H10K 59/122* (2023.02); *H10K 50/844* (2023.02); *H10K 71/00* (2023.02); *H10K 59/1201* (2023.02); *H10K 2102/311* (2023.02)

(58) Field of Classification Search
CPC ............ H10K 59/122; H10K 59/8723; H10K 50/8423; H10K 2102/311
See application file for complete search history.

(56) References Cited

U.S. PATENT DOCUMENTS

| 9,666,650 B2 | 5/2017 | Zhang | |
|---|---|---|---|
| 10,921,857 B2 * | 2/2021 | Kim | .................. G09F 9/301 |

(Continued)

FOREIGN PATENT DOCUMENTS

| KR | 10-2016-0104804 | 9/2016 |
|---|---|---|
| KR | 10-2020-0091059 | 7/2020 |

*Primary Examiner* — Victoria K. Hall
(74) *Attorney, Agent, or Firm* — F. CHAU & ASSOCIATES, LLC

(57) ABSTRACT

A display device includes a via layer disposed on a substrate and including a via groove having a shape recessed from a first surface to a second surface of the via layer. A first electrode is disposed on the first surface. A pixel-defining film is disposed on the via layer and the first electrode. A first pixel-defining film through-hole passes through the pixel-defining film in a thickness direction and exposes the first electrode. A second pixel-defining film through-hole passes through the pixel-defining film in the thickness direction. The second pixel-defining film through-hole is spaced apart from the first pixel-defining film through-hole and overlaps the via groove. An emission layer is disposed on an exposed portion of the first electrode. A protrusion is disposed on the pixel-defining film and includes a protrusion through-hole which passes through the protrusion in the thickness direction and overlaps the second pixel-defining film through-hole.

18 Claims, 14 Drawing Sheets

(51) Int. Cl.
*H10K 59/12* (2023.01)
*H10K 102/00* (2023.01)

(56) References Cited

U.S. PATENT DOCUMENTS

| | | | |
|---|---|---|---|
| 11,573,606 B2* | 2/2023 | Kim | H10K 59/122 |
| 2016/0284774 A1 | 9/2016 | Zhang | |
| 2018/0062109 A1* | 3/2018 | Kim | H10K 50/813 |
| 2018/0261797 A1* | 9/2018 | Lee | H10K 30/865 |
| 2020/0052237 A1 | 2/2020 | Wang et al. | |
| 2020/0168823 A1* | 5/2020 | Kim | H10K 50/844 |
| 2020/0310493 A1* | 10/2020 | Kim | H10K 59/124 |
| 2021/0050395 A1* | 2/2021 | Okabe | H10K 59/122 |
| 2021/0408444 A1* | 12/2021 | Ouyang | H10K 50/865 |

* cited by examiner

NFA: NFA1, NFA2

DISPLAY DEVICE AND METHOD OF MANUFACTURING THE SAME

This application claims priority under 35 U.S.C. § 119 to Korean Patent Application No. 10-2020-0187105, filed on Dec. 30, 2020 in the Korean Intellectual Property Office, the disclosure of which is incorporated by reference in its entirety herein.

1. TECHNICAL FIELD

The present inventive concepts relate to a display device and a method of manufacturing the same.

2. DISCUSSION OF RELATED ART

Display devices for displaying an image are being applied to various different electronic devices with the advancement of the information society. For example, the display device is applied to various electronic devices such as a smartphone, a digital camera, a laptop computer, a navigation device, and a smart TV.

The display device may include a light-receiving type display device, such as a liquid crystal display device, a field emission display device, and a light-emitting display device, and a light-emitting display device such as an organic light-emitting display device including an organic light-emitting element, an inorganic light-emitting display device including an inorganic light-emitting element such as an inorganic semiconductor, and a micro light-emitting display device including a micro light-emitting element.

SUMMARY

An aspect of the present inventive concepts provides a display device in which adhesion of a thin film encapsulation layer is increased.

Aspects of the present inventive concepts are not limited to the aspects mentioned above, and other technical aspects not mentioned above will be clearly understood by those skilled in the art from the following description.

According to an embodiment of the present inventive concepts, a display device includes a substrate. A via layer is disposed on the substrate and includes a via groove having a shape recessed from a first surface to a second surface opposite to the first surface. A first electrode is disposed on the first surface of the via layer. A pixel-defining film is disposed on the via layer and the first electrode. The pixel-defining film includes a first pixel-defining film through-hole passing through the pixel-defining film in a thickness direction and exposing a portion of the first electrode. The pixel-defining film further includes a second pixel-defining film through-hole passing through the pixel-defining film in the thickness direction. The second pixel-defining film through-hole is spaced apart from the first pixel-defining film through-hole, and overlaps the via groove. An emission layer is disposed on the portion of the first electrode exposed by the pixel-defining film. A protrusion is disposed on the pixel-defining film and includes a protrusion through-hole which passes through the protrusion in the thickness direction and overlaps the second pixel-defining film through-hole.

According to an embodiment of the present inventive concepts, a display device includes a substrate A via layer is disposed on the substrate and includes a via groove having a shape recessed from a first surface to a second surface opposite to the first surface. A first electrode is disposed on the first surface of the via layer. A pixel-defining film is disposed on the via layer and the first electrode. The pixel-defining film includes a first pixel-defining film through-hole passing through the pixel-defining film in a thickness direction and exposing a portion of the first electrode. The pixel-defining film further includes a second pixel-defining film through-hole passing through the pixel-defining film in the thickness direction. The second pixel-defining film through-hole is spaced apart from the first pixel-defining film through-hole, and overlaps the via groove. An emission layer is disposed on the portion of the first electrode exposed by the pixel-defining film. A second electrode is disposed on the pixel-defining film and the emission layer. A first encapsulation layer is disposed on the second electrode. The second electrode and the first encapsulation layer are disposed along an inner wall of the second pixel-defining film through-hole and an inner w all and a bottom surface of the via groove.

According to an embodiment of the present inventive concepts, a method of manufacturing a display device includes preparing a substrate including a via layer, a first electrode disposed on the via layer, a pixel-defining film disposed on the via layer and the first electrode, and a protrusion disposed on the pixel-defining film. A mask pattern is disposed on the substrate. The mask pattern exposes a portion of the protrusion. The protrusion, the pixel-defining film, and the via layer are etched through the mask pattern. After the etching, the via layer includes a via groove having a shape recessed from a first surface to a second surface opposite to the first surface, the pixel-defining film includes a second pixel-defining film through-hole passing through the pixel-defining film in a thickness direction, and the protrusion includes a protrusion through-hole passing through the protrusion in the thickness direction. The via groove, the second pixel-defining film through-hole, and the protrusion through-hole overlap each other.

According to a display device of embodiments of the present inventive concepts, adhesion of a thin film encapsulation layer is increased, thereby increasing the reliability of the display device.

Effects according to embodiments of the present inventive concepts are not limited by the contents illustrated above, and more various effects are included in the present specification.

BRIEF DESCRIPTION OF THE DRAWINGS

The above and other aspects and features of the present inventive concepts will become more apparent by describing in detail embodiments thereof with reference to the attached drawings, in which.

DETAILED DESCRIPTION OF EMBODIMENTS

The present inventive concepts will now be described more fully hereinafter with reference to the accompanying drawings, in which embodiments of the present inventive concepts are shown. This present inventive concepts may, however, be embodied in different forms and should not be construed as limited to embodiments set forth herein. Rather, these embodiments are provided to convey present inventive concepts to those skilled in the art.

It will also be understood that when a layer is referred to as being "on" another layer or substrate, it can be directly on the other layer or substrate, or intervening layers may also be present. When a layer is referred to as being "directly on" another layer or substrate, no intervening layers may be present. The same reference numbers indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments will be described with reference to the accompanying drawings.

Figure 1:
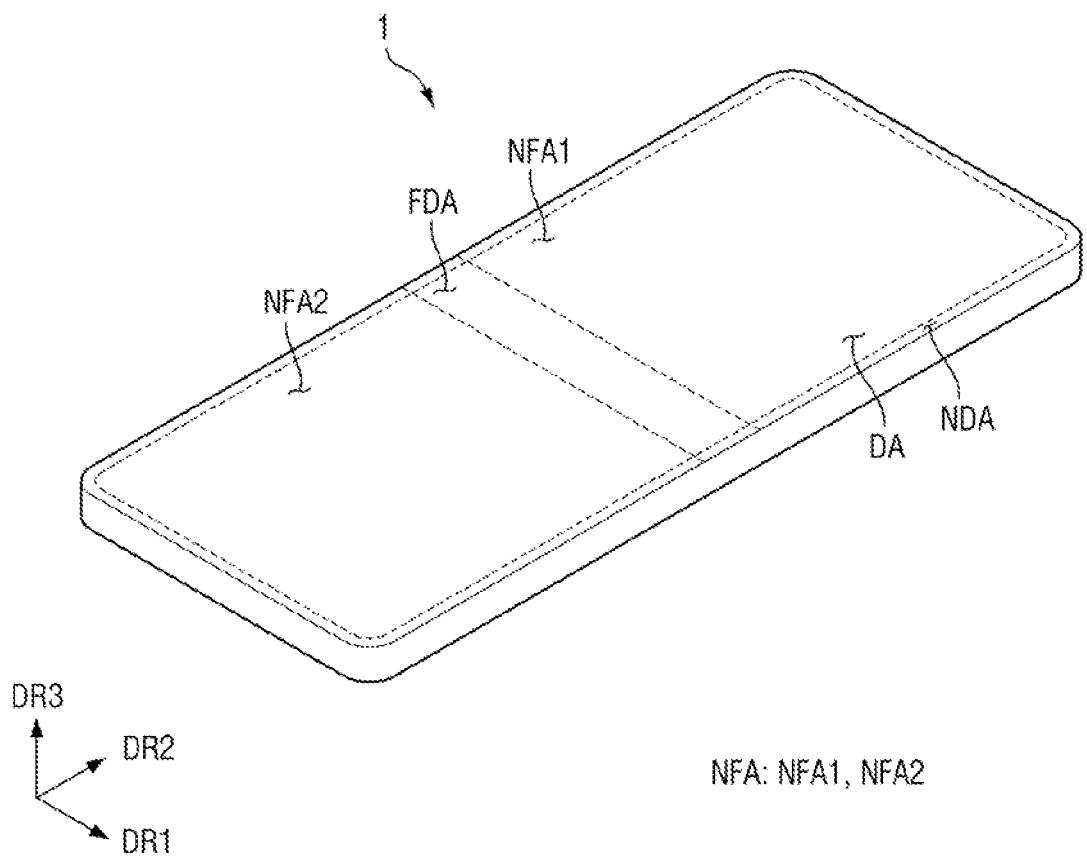
FIG. 1 is a perspective view of a display device in an unfolded state according to an embodiment of the present inventive concepts.
Figure 2:
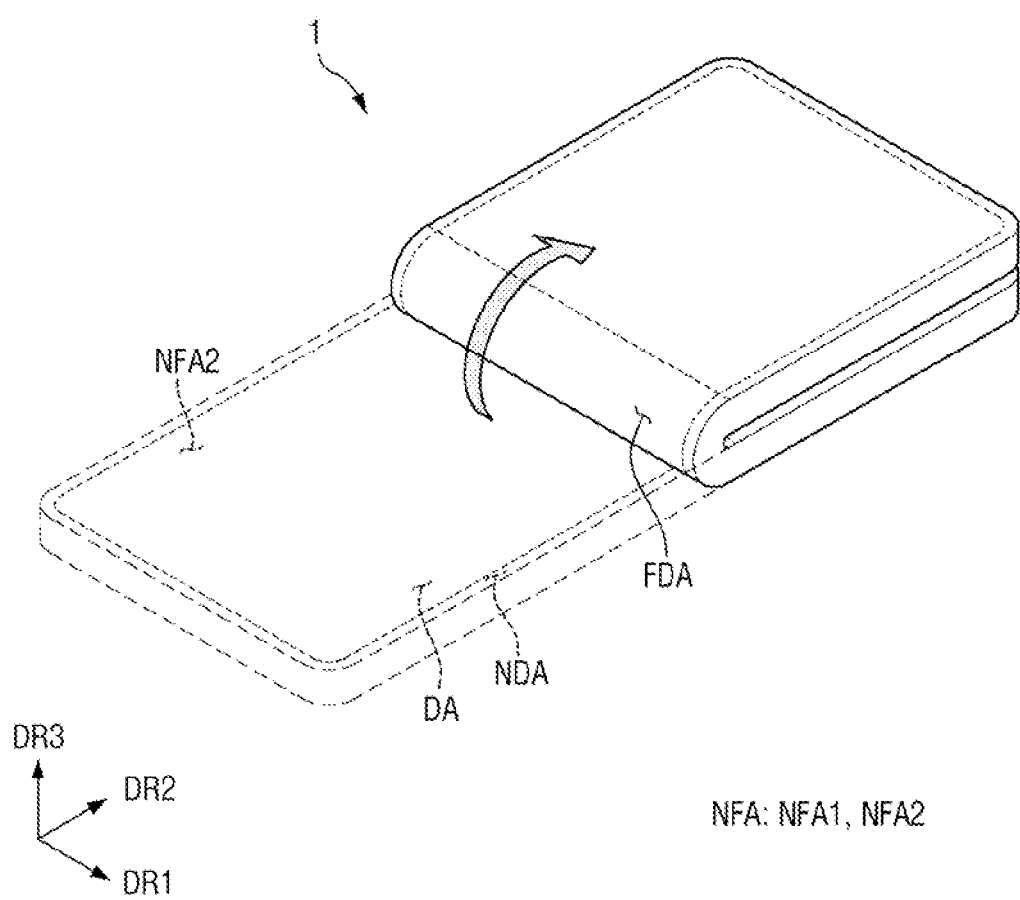
FIG. 2 is a perspective view of the display device in a folded state according to an embodiment of the present inventive concepts.

FIG. 1 is a perspective view of a display device according to an embodiment in an unfolded state. FIG. 2 is a perspective view of the display device according to an embodiment in a folded state. FIG. 2 shows the display device according to an embodiment in an in-folded state.

Referring to the embodiments of FIGS. 1 and 2, a display device 1 displays an image through a display area DA to be described later, and the display device 1 may be applied to various different devices. For example, in an embodiment, the display device 1 may be applied to a mobile phone, a tablet PC, a personal digital assistant (PDA), a portable multimedia player (PMP), a television, a game console, a wrist watch type electronic device, a head-mounted display, a personal computer monitor, a laptop computer, a car navigation device, a car dashboard, a digital camera, a camcorder, an outdoor billboard, an electronic signage, a medical device, an inspection device, various home appliances such as a refrigerator and a washing machine, or an Internet of Things device in addition to a smart phone. However, embodiments of the present inventive concepts are not limited thereto.

The display device 1 includes the display area DA and a non-display area NDA. The display area DA may display an image. The display area DA may include a plurality of pixels. In an embodiment, tire plurality of pixels may be arranged in a matrix form. The non-display area NDA may be an area in which an image is not displayed. When the display device 1 has a touch sensing function, the display device 1 may include a touch region in which a touch input is sensed, and the touch region may overlap the display area DA. In an embodiment, the touch region may be substantially the same as the display area DA. However, embodiments of the present inventive concepts are not limited thereto.

In an embodiment, a shape of the display area DA may correspond to a shape of the display device 1 to which the display area DA is applied. For example, the display area DA may have a rectangular shape of which corners have a right angle or a rectangular shape with rounded corners on a plane. However, the planar shape of the display area DA is not limited to the rectangular shape illustrated in the drawing, and may have a circular shape, an elliptical shape, or various shapes.

In the embodiment shown in FIG. 1, a relatively shorter side of the rectangular shape of the display area DA extends in a first direction DR1 and a relatively longer side extends in a second direction DR2 perpendicular to tire first direction DR1. However, embodiments of the present inventive concepts are not limited thereto and the relatively longer sides and relatively shorter sides of the display area DA may be variously arranged. A third direction DR3 is perpendicular to each of the first direction DR1 and the second direction DR2, and may refer to a thickness direction of the display device 1. However, the directions to be mentioned in the embodiments should be understood as referring to relative directions, and embodiments of the present inventive concepts are not limited to the mentioned directions.

Unless otherwise defined, in the present specification, the terms "upper portion", "upper surface" and "upper side" expressed with respect to the third direction DM refer to a display surface side with respect to a display panel 10, and the terms "lower portion", "lower surface" and "lower side" refer to an opposite side of the display surface with respect to the display panel 10.

The non-display area NDA may surround a periphery of the display area DA. For example, in an embodiment, the non-display area NDA may surround all sides of the display area DA (e.g., in the first and second directions DR1, DR2). However, embodiments of the present inventive concepts are not limited thereto, and the non-display area NDA may not be disposed near at least a portion of the four sides of the display area DA. For example, the display area DA may extend to at least one edge of the display device 1 and the non-display area NDA may not be disposed adjacent to the at least one edge. A bezel area of the display device 1 may be constituted as the non-display area NDA.

In an embodiment, the display device 1 may be a foldable display device. In the present specification, the foldable display device is a display device capable of folding, and refers to a display device capable of having both a folded state and an unfolded state. In addition, folding typically includes folding at an angle of about 180°. However, embodiments of the present inventive concepts are not limited thereto, and when the folding angle exceeds or is less than 180°, for example, when the folding angle is 90° or more and less than 180° or 120° or more and less than 180°, it may be considered as folded. In addition, even though a folded state is not completely performed, when the folded state is out of an unfolded state and is in a bent state, it may be referred to as the folded state. For example, even though the display device is bent at an angle of 90° or less, as long as a maximum folding angle is 90° or more, it may be expressed as being in the folded state to distinguish it from the unfolded state.

The display device 1 may include a folding area FDA (or a folding line). The display device 1 may be folded based on the folding area FDA. A folding method may be divided into an in-folding method in which a display surface of the display device is folded inward and an out-folding method in which the display surface of the display device 1 is folded outward. FIG. 2 illustrates the display device 1 in an in-folded state. However, embodiments of the present inventive concepts are not limited thereto, and the display device 1 may be folded in an out-folding method.

In addition, the display device 1 may be folded only in cote of the in-folding method and the out-folding method, or the display device 1 may be folded in both in-folding and out-folding. In an embodiment which the display device 1 may perform both in-folding and out-folding, in-folding and out-folding may be performed based on the same folding area (FDA), and the display device may include a plurality of folding areas that perform different types of folding, such as an in-folding exclusive folding area and an out-folding exclusive folding area.

The folding area FDA may extend longitudinally in a direction parallel to one side of the display device 1. For example, in an embodiment, the folding area FDA may extend longitudinally in the first direction DR1 in which a relatively short side of the display device 1 extends. In the display device 1 having a rectangular shape in which a side extending in the second direction DR2 illustrated in the drawing is relatively longer than a side extending in the first direction DR1, when the display device f has the folding area FDA extending in the first direction DR1, a relatively longer side (e.g., a side extending in the second direction DR2) of the display device 1 is reduced to half or less before and after folding, but the relatively shorter side (the side extending in the first direction DR1) may be maintained as it is. However, embodiments of the present inventive concepts are not limited thereto. For example, an embodiment, the folding area FDA may extend in the same direction (e.g., the second direction DR2) as the extension direction of the relatively longer side (e.g., the side extending in the second direction DR2).

The folding area FDA may also have a predetermined width in the second direction DR2. In an embodiment, the width of the folding area FDA in the second direction DR2 may be smaller than a width in the first direction DR1.

The display device 1 may include a non-folding area NFA disposed around the folding area FDA. As shown in the embodiment of FIG. 1, the non-folding area NFA may include a first non-folding area NFA1 positioned at one side (e.g., an upper side) of the folding area FDA in the second direction DR2 and a second non-folding area NFA2 positioned at the other side (e.g., a lower side) of the folding area FDA in the second direction DR2. In an embodiment, widths of the first non-folding area NFA1 and the second non-folding area NFA2 in the second direction DR2 may be substantially the same as each other. However, embodiments of the present inventive concepts are not limited thereto, and the width of the first non-folding area NFA1 in the second direction DR2 and the width of the second non-folding area NFA2 in the second direction DR2 may be different from each other according to a position of the folding area FDA.

The display area DA/non-display area NDA and the folding area FDA/non-folding area NFA of the display device 1 described above may overlap each other at the same position. For example, a specific position may be the display area DA, and at the same time, may be the first non-folding area NFA1. Another specific position may be the non-display area NDA, and at the same time, may be the first non-folding area NFA1. Still another specific position may be the display area DA, and at the same time, may be the folding area FDA.

The display area DA may be disposed over both the first non-folding area NFA1 and the second non-folding area NFA2. Further, the display area DA may also be positioned in the folding area FDA corresponding to a boundary between the first non-folding area NFA1 and the second non-folding area NFA2. For example, the display area DA of the display device 1 may be continuously disposed regardless of boundaries of the non-folding area NFA, the folding area FDA, and the like. However, the present inventive concepts are not limited thereto. For example, in an embodiment, the display area DA may be positioned only in one of the first non-folding area NFA1 and the second non-folding area NFA2 and may or may not be positioned in the folding area FDA. In an embodiment, the display area DA is disposed in the first non-folding area NFA1 and the second non-folding area NFA2, but the display area DA may not be disposed in the folding area FDA.

Figure 3:
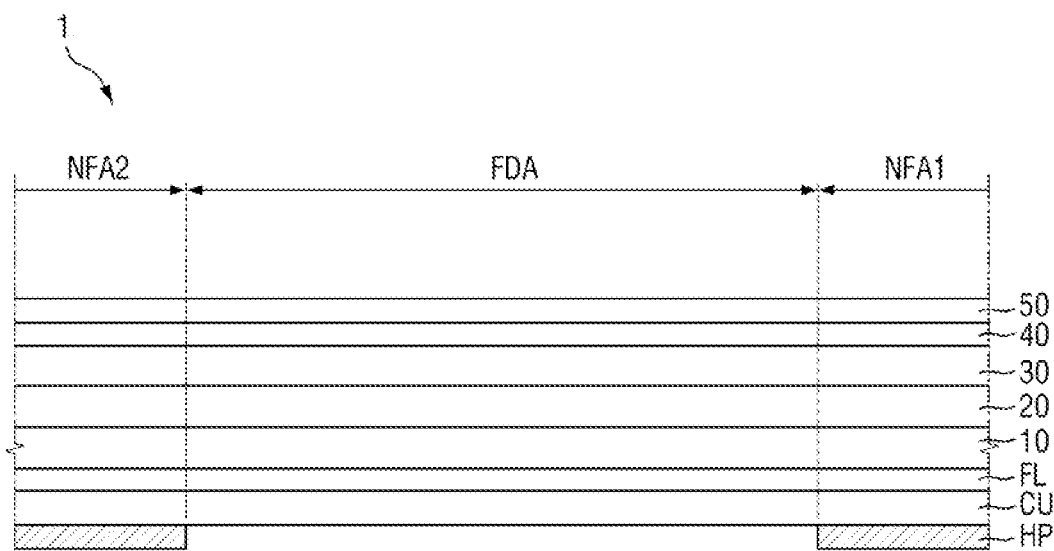
FIG. 3 is a cross-sectional view of the display device in an unfolded state according to an embodiment of the present inventive concepts.
Figure 3:
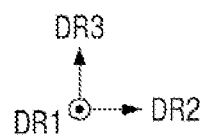
Figure 4:
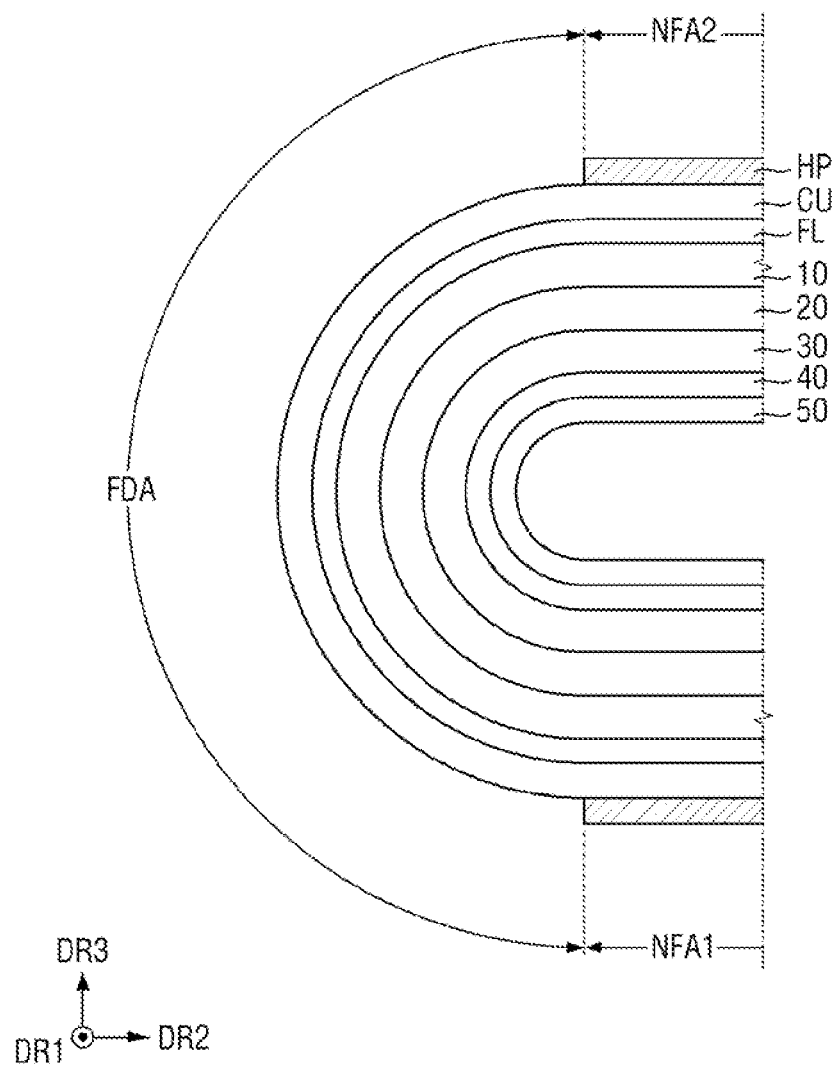
FIG. 4 is a cross-sectional view of the display device in an in-folded state according to an embodiment of the present inventive concepts.

FIG. 3 is a cross-sectional view of the display device according to an embodiment in an unfolded state. FIG. 4 is a cross-sectional view of the display device according to an embodiment in an in-folded state.

Referring to the embodiments of FIGS. 3 and 4, the display device 1 may include the display panel 10, an antireflection member 20, a shock absorbing layer 30, a cover window 40, and a cover window protective layer 50 that are sequentially stacked on one side in the thickness direction (e.g., an upper side in the third direction DR3) of the display panel 10, and a polymer film layer FL, a cushion layer CU, and a heat dissipation member HP that are sequentially stacked on the other side in the thickness direction (e.g., a lower side in the third direction DR3) of the display panel 10. However, embodiments of the present inventive concepts are not limited thereto, and another layer may be further disposed between each of the layers, and a part of the stacked members may be omitted. In addition, at least one coupling member such as an adhesive layer may be disposed between the stacked members to couple adjacent stacked members.

The display panel 10 is a panel that displays an image, and for example, the display panel 10 may include not only a self-luminous display panel such as an organic light-emitting display panel, an inorganic light-emitting display panel, a quantum dot light-emitting display panel, a micro-LED display panel, a nano LED display panel, a plasma display panel, a field emission display panel, a cathode ray display panel, or the like but also a light-receiving display panel such as a liquid crystal display panel, an electrophoretic display panel, or the like. Hereinafter, the organic light-emitting display panel will be described as an example of the display panel 10 for convenience of explanation, and as long as no special distinction is required, the organic light-emitting display panel applied to the embodiment is simply abbreviated as the display panel. However, embodiments of the present inventive concepts are not limited to the organic light-emitting display panel, and another display panel listed above or known in the art may be applied within a scope of the present inventive concepts. A detailed structure of the display panel 10 will be described later.

The antireflection member 20 may be disposed on the display panel 10. The antireflection member 20 may serve to reduce reflection of external light. In an embodiment, the antireflection to ember 20 may be provided in a form of a polarizing film. In this embodiment, the antireflection member 20 polarizes passing light. However, embodiments of the present inventive concepts are not limited thereto, and the antireflection member 20 may be provided as a color filter layer in the display panel 10.

The shock absorbing layer 30 may be disposed on the antireflection member 20. The shock absorbing layer 30 may increase the durability of the cover window 40, and to increase optical performance. The shock absorbing layer 30 may be optically transparent. However, embodiments of the present inventive concepts are not limited thereto. For example, an embodiment, the shock absorbing layer 30 may be omitted.

The cover window 40 may be disposed on the shock absorbing layer 30. The cover window 40 may serve to cover and protect the display panel 10. The cover window 40 may be made of a transparent material. In an embodiment, the cover window 40 may include, for example, glass or plastic.

In an embodiment in which the cover window 40 includes glass, the glass may be ultra-thin glass (UTG) or thin-film glass. In an embodiment in which the cover window 40 includes plastic, the plastic may be transparent polyimide. However, embodiments of the present inventive concepts are not limited thereto. The cover window 40 may have flexible properties to be bent, or may have properties capable of being bent, folded, and rolled.

The cover window protective layer 50 may be disposed on the cover window 40. In an embodiment, the cover window protective layer 50 may perform at least one of functions of preventing scattering, absorbing shock, preventing denting, preventing fingerprints, and preventing glare of the cover window 40. The cover window protective layer 50 may include a transparent polymer film. However, embodiments of the present inventive concepts are not limited thereto. For example, in an embodiment, the cover window protective layer 50 may be omitted.

The polymer film layer FL may be disposed under the display panel 10. The polymer film layer FL may contain, for example, at least one compound selected from polyimide (PE), polyethylene terephthalate (PET), polycarbonate (PC), polyethylene (PE), polypropylene (PP), polysulfone (PSF), polymethyl methacrylate (PMMA), triacetyl cellulose (TAC), cycloolefin polymer (COP), or the like. The polymer film layer FL may include a functional layer on at least one surface thereof. The functional layer may include, for example, a light absorbing layer. The light absorbing layer may include a light absorbing material such as a black pigment or dye. For example, the light absorbing layer may be black ink, and may be formed on the polymer film by a coating or printing method.

The cushion layer CU may be disposed under the polymer film layer FL (e.g., in the third direction DR3). The cushion layer CU increases durability against an impact that may be applied in the thickness direction (e.g., the third direction DR3) of the display device 1, and when the display device 1 is dropped, the cushion layer CU may serve to reduce the drop impact on the display device 1. In an embodiment, the cushion layer CU may contain polyurethane or the like.

The heat dissipation member HP ma be disposed under the polymer film layer FL. The heat dissipation member HP serves to diffuse heat generated from the display panel 10 or other components of the display device 1. In an embodiment, the heat dissipation member HP may include a metal plate. The metal plate may include, for example, a metal having excellent thermal conductivity, such as copper or silver. The heat dissipation member HP may also include a heat dissipation sheet containing graphite, carbon nanotubes, or the like. However, embodiments of the present inventive concepts are not limited thereto.

To facilitate the folding of the display device 1, some layers of the display device 1 may be separated based on the folding area FDA. For example, the heat dissipation member HP constituting the lowermost layer of the display device 1 and having low ductility may be separated based on the folding area FDA.

The cushion layer CU or the polymer film layer FL may also be separated based on the folding area FDA, but when the cushion layer CU or the polymer film layer FL have sufficient ductility, the cushion layer CU or the polymer film layer FL may also be connected integrally regardless of the folding area FDA and the non-folding area NFA.

When the display device 1 is in-folded based on the folding area FDA, as illustrated in the embodiment of FIG. 4, the second non-folding area NFA2 may overlap the first non-folding area NFA1 in the thickness direction (e.g., the third direction DR3). In an embodiment, unlike the separated heat dissipation member HP, the display panel 10, the polymer film layer FL, the cushion layer CU, the antireflection member 20, the cover window 40, and the cover window protective layer 50 are connected regardless of the folding area FDA and may be bent so as to form a curve in a cross-sectional view along a width direction of the folding area FDA.

Hereinafter, a specific stacked structure of the display panel 10 according to embodiments will be described with reference to FIGS. 5 and 6.

Figure 5:
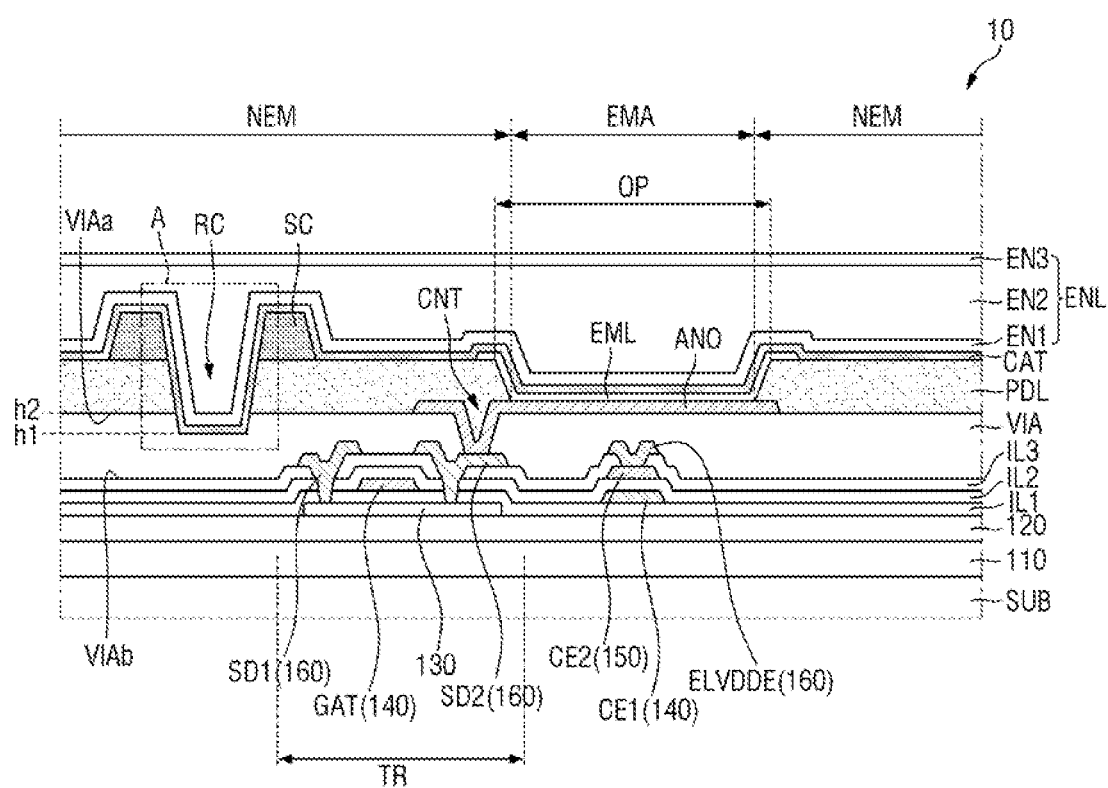
FIG. 5 is a cross-sectional view of a display panel according to an embodiment of the present inventive concepts.

FIG. 5 is a cross-sectional view of a display panel according to one embodiment. FIG. 6 is an enlarged view of region A in FIG. 5.

Figure 6:
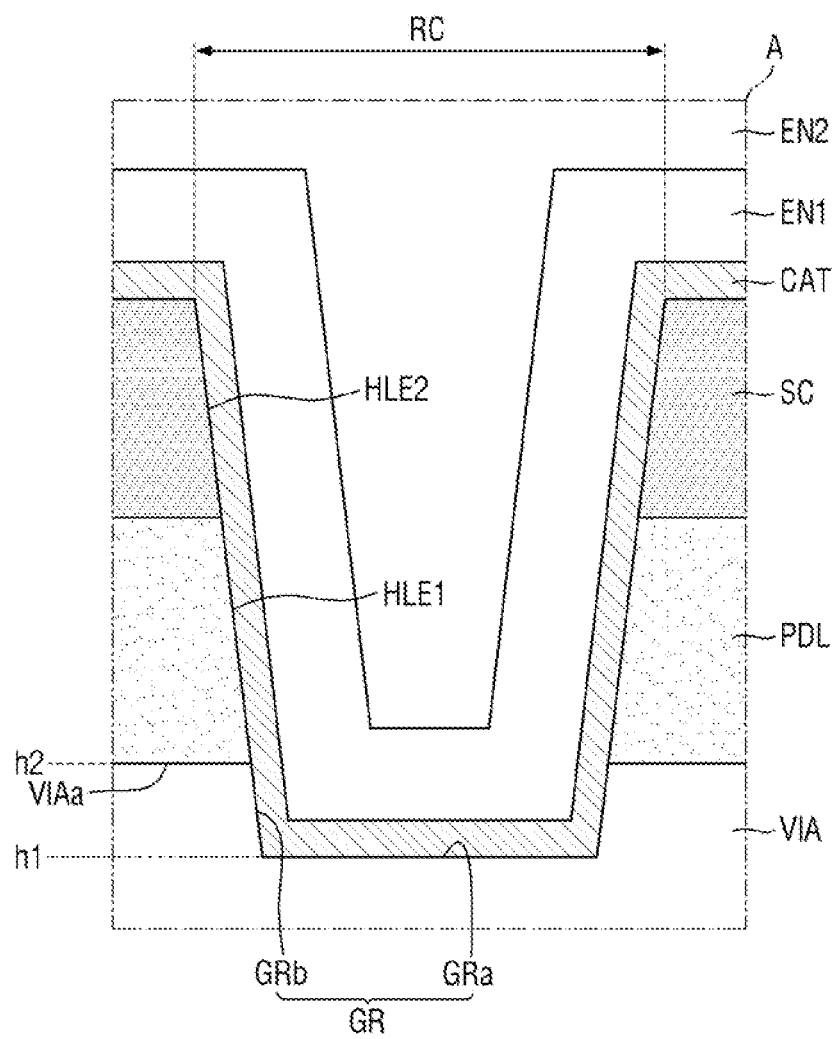
FIG. 6 is an enlarged view of region A in FIG. 5 according to an embodiment of the present inventive concepts.

As shown in the embodiments of FIGS. 5 and 6, the display panel 10 may include a plurality of pixels, and each pixel may include at least one thin film transistor TR. The display panel 10 may include a substrate SUB, a barrier layer 110, a buffer layer 120, a semiconductor layer 130, a first insulating layer IL1, a first gate conductive layer 140, a second insulating layer IL2, a second gate conductive layer 150, a third insulating layer IL3, a data conductive layer 160, a via layer VIA, an anode ANO, a pixel-defining film PDL including a first pixel-defining film through-hole OP exposing the anode ANO, a protrusion SC disposed on the pixel-defining film PDL, an emission layer EML disposed in the first pixel-defining film through-hole OP of the pixel-defining film PDL, a cathode CAT disposed on the emission layer EML and the pixel-defining film PDL, and an encapsulation layer ENL disposed on the cathode CAT. In an embodiment, the layers described above may be formed of a single film, but may also be formed of a stacked film including a plurality of films. However, embodiments of the present inventive concepts are not limited thereto. For example, in an embodiment, one or more additional layers may be further disposed between the layers.

The substrate SUB may support the layers disposed thereon. In m embodiment, the substrate SUB may be made of an insulating material such as a polymer resin, or may be made of an inorganic material such as glass or quartz. However, embodiments of the present inventive concepts are not limited thereto, and the substrate SUB may be a transparent plate or a transparent film.

In an embodiment, the substrate SUB may be a flexible substrate capable of bending, folding, rolling, etc. However, embodiments of the present inventive concepts are not limited thereto, and the substrate SUB may be a rigid substrate.

The barrier layer 110 is disposed on the substrate SUB (e.g., directly thereon n the third direction DR3). The barrier layer 110 may prevent diffusion of impurity ions, may prevent penetration of moisture or outside air, and may perform a surface planarization function. In an embodiment, the barrier layer 110 may contain at least one compound selected from silicon oxide ($SiO_x$), silicon nitride ($SiN_x$), and silicon oxynitride ($SiO_xN_y$). However, embodiments of the present inventive concepts are not limited thereto. For example, in an embodiment, the barrier layer 110 may be omitted depending on the type of the substrate SUB, process conditions, or the like.

The buffer layer 120 is disposed on the barrier layer 110 (e.g., directly thereon in the third direction DR3). The buffer layer 120 may prevent diffusion of impurity ions, may prevent penetration of moisture or outside air, and may perform a surface planarization function. In an embodiment, the buffer layer 120 may contain silicon nitride ($SiN_x$), silicon oxide ($SiO_x$), or silicon oxynitride ($SiO_xN_y$). However, embodiments of the present inventive concepts are not limited thereto. For example, in an embodiment, the buffer layer 120 may be omitted depending on the type of the substrate SUB, process conditions, or the like.

The semiconductor layer 130 is disposed on the buffer layer 120. The semiconductor layer 130 forms a channel of the thin film transistor TR of the pixel. In an embodiment, the semiconductor layer 130 may include polycrystalline silicon. However, embodiments of the present inventive concepts are not limited thereto, and the semiconductor layer 130 may include at least one material selected from single crystal silicon, low temperature polycrystalline silicon, and amorphous silicon.

In an embodiment, the semiconductor layer 130 may include an oxide semiconductor. For example, the oxide semiconductor may include at least one compound selected from indium gallium zinc oxide (IGZO), zinc tin oxide (ZTO), indium tin oxide (ITO), and the like.

The first insulating layer IL1 is disposed on the semiconductor layer 130 and the buffer layer 120 (e.g., directly thereon in the third direction DR3). The first insulating layer IL1 may be a first gate insulating film having a gate insulating function. In an embodiment, the first insulating layer IL1 may include at least one material selected from a silicon compound and a metal oxide.

The first gate conductive layer 140 is disposed on the first insulating layer IL1 (e.g., directly thereon in the third direction DR3). The first gate conductive layer 140 may include a gate electrode GAT of the thin film transistor TR of the pixel, a scan line connected thereto, and a first electrode CE1 of a storage capacitor.

In an embodiment, the first gate conductive layer 140 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). However, embodiments of the present inventive concepts are not limited thereto.

The second insulating layer IL2 may be disposed on the first gate conductive layer 140 and the first insulating layer IL1 (e.g., directly thereon in the third direction DR3). The second insulating layer IL2 may be an interlayer insulating film or a second gate insulating film. In an embodiment, the second insulating layer IL2 may contain an inorganic insulating material such as silicon oxide, silicon nitride, silicon oxynitride, hafnium oxide, aluminum oxide, titanium oxide, tantalum oxide, or zinc oxide. However, embodiments of the present inventive concepts are not limited thereto.

The second gate conductive layer 150 is disposed on the second insulating layer IL2 (e.g., directly thereon in the third direction DR3). The second gate conductive layer 150 may include a second electrode CE2 of the storage capacitor. In an embodiment, the second gate conductive layer 150 may contain at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an embodiment, the second gate conductive layer 150 may be made of the same material as the first gate conductive layer 140. However, embodiments of the present inventive concepts are not limited thereto.

The third insulating layer IL3 is disposed on the second gate conductive layer 150 and the second insulating layer IL2 (e.g., directly thereon in the third direction DR3). The third insulating layer IL3 may be an interlayer insulating film. In an embodiment, the third insulating layer IL3 may contain an inorganic insulating material such as at least one material selected from silicon oxide, silicon nitride, silicon oxynitride, hafnium oxide, aluminum oxide, titanium oxide, tantalum oxide, or zinc oxide.

The data conductive layer 160 is disposed on the third insulating layer IL3 (e.g., directly thereon in the third direction DR3). As shown in the embodiment of FIG. 5, the data conductive layer 160 may include a first electrode SD1 and a second electrode SD2 of the thin film transistor TR of one pixel of the display panel, and a first power line ELVDDE. The first electrode SD1 and the second electrode SD2 of the thin film transistor TR may be electrically connected to a source region and a drain region of the semiconductor layer 130 through a contact hole passing through the third insulating layer IL3, the second insulating layer IL2, and the first insulating layer IL1. The first power voltage electrode ELVDDE may be electrically connected to the second electrode CE2 of the storage capacitor through a contact hole passing through the third insulating layer IL3.

In an embodiment, the data conductive layer 160 may contain at least one metal selected from aluminum (Al), molybdenum (Mo), platinum (Pt), palladium (Pd), silver (Ag), magnesium (Mg), gold (Au), nickel (Ni) neodymium (Nd), iridium (Ir), chromium (Cr), calcium (Ca), titanium (Ti), tantalum (Ta), tungsten (W), and copper (Cu). The data conductive layer 160 may be a single film or a multilayer film. For example, the data conductive layer 160 may be formed in a stacked structure such as Ti/Al/Ti, Mo/AlGe/Mo, Ti/Cu, or the like.

The via layer VIA (or a planarization layer) is disposed on the data conductive layer 160 and the third insulating layer IL3 (e.g., directly thereon in the third direction DR3). The via layer VIA covers the data conductive layer 160. The via layer VIA may be a via layer. The via layer VIA may contain an organic insulating material. In an embodiment in which the via layer VIA contains the organic material, an upper surface thereof may be generally flat despite a step thereunder.

The via layer VIA may include a first surface VIAa (e.g. an upper surface in the third direction DR3) and the second surface VIAb (e.g., a lower surface in the third direction DR3), which is a surface opposite to the first surface VIAa. The first surface VIAa of the via layer VIA (e.g., an upper surface in the third direction DR3) may face the second surface (e.g., a lower surface in the third direction DR3) of the pixel-defining film PDL, and the second surface VIAb of the via layer VIA may face a first surface (e.g., an upper surface in the third direction DR3) of the third insulating layer IL3.

As shown in the embodiment of FIG. 6, the via layer VIA may further include a via groove GR (e.g., a via recess pattern). The via groove GR may be defined by the via layer VIA. The via groove GR may have a shape recessed from the first surface VIAa of the via layer VIA (e.g., an upper surface in the third direction DR3) toward the second surface VIAb (e.g., a lower surface in the third direction DR3). The via groove GR may include a bottom surface GRa and an inner wall GRb extending from the bottom surface GRa substantially in the thickness direction. The inner wall GRb of the via groove GR may be connected to the first surface VIAa of the via layer VIA. In an embodiment, the via groove GR may be defined by removing at least a portion of the via layer VIA. In an embodiment in which the via groove GR is defined by removing a portion of the via layer VIA, the via groove GR may be defined by removing a portion of an upper layer of the via layer VIA. The via groove GR may form a portion of a recess pattern RC. For example, the via groove GR may form a lower portion of the recess pattern RC (e.g., in the third direction DR3).

The anode ANO is disposed on the via layer VIA. For example, the anode ANO may be disposed on the first surface VIAa of the via layer VIA (e.g., an upper surface in the third direction DR3). In an embodiment, the anode ANO may be a pixel electrode provided for each pixel. The anode ANO may be connected to the second electrode SD2 of the thin film transistor TR through a contact hole CTNT passing through the via layer VIA. The anode ANO may at least partially overlap an emission area EMA of the pixel.

In an embodiment, the anode ANO may have a stacked film structure in which a material layer having a high work function such as indium tin oxide (ITO), indium zinc oxide (IZO), zinc oxide (ZnO), or indium oxide ($In_2O_3$) and a reflective material layer such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a mixture thereof are stacked. However, embodiments of the present inventive concepts are not limited thereto. The layer having a high work function may be disposed above the reflective material layer to be near the emission layer EL. In an embodiment, the anode ANO may have a multi-layer structure of ITO/Mg, ITO/MgF, ITO/Ag, or ITO/Ag/ITO. However, embodiments of the present inventive concepts are not limited thereto.

The pixel-defining film PDL may be disposed on the anode ANO (e.g., directly thereon in the third direction DR3). The pixel-defining film PDL may be disposed on the anode ANO, and may include the first pixel-defining film through-hole OP exposing the anode ANO. The first pixel-defining film through-hole OP is defined by the pixel-defining film PDL, and may pass through the pixel-defining film PDL in the thickness direction. The emission area EMA and a non-emission area NEM that is disposed around the emission area EMA may be divided by the pixel-defining film PDL and the first pixel-defining film through-hole OP. The pixel-defining film PDL may contain an organic insulating material. However, embodiments of the present inventive concepts are not limited thereto, and the pixel-defining film PDL may contain an inorganic material.

The pixel-defining film PDL may further include a second pixel-defining film through-hole HLE1. The second pixel-defining film through-hole HLE1 may be defined by the pixel-defining film PDL. The second pixel-defining film through-hole may pass through the pixel-defining film PDL in the thickness direction (e.g., the third direction DR3). The second pixel-defining film through-hole HLE1 may be separated from the first pixel-defining film through-hole OP (e.g., in the first and/or second directions DR1, DR2) to be spaced apart from each other. The second pixel-defining film through-hole Hill is disposed in the non-emission area NEM, and the second pixel-defining film through-hole HLE1 may not overlap the anode ANO (e.g., in the third direction DR3). For example, the recess pattern RP RC may be disposed in the non-emission area NEM and may not overlap the anode ANO.

The second pixel-defining film through-hole HLE1 may overlap the via groove GR of the via layer VIA (e.g., in the third direction DR3). The second pixel-defining film through-hole HLE1 may expose the via layer VIA thereunder. For example, the second pixel-defining film through-hole HLE1 may expose the bottom surface GRa and the inner wall GRb of the via groove GR of the via layer VIA. As shown in the embodiment of FIG. 6, the inner wall of the pixel-defining film PDL defining the second pixel-defining film through-hole HLE1 may be aligned with the inner wall GRb of the via groove GR of the via layer VIA. However, embodiments of the present inventive concepts are not limited thereto. The second pixel-defining film through-hole HLE1 may form a portion of the recess pattern RC.

In an embodiment, the protrusion SC may be disposed on the pixel-defining film PDL (e.g., directly thereon in the third direction DR3). The protrusion SC may protrude from at least a partial region of a first side of the pixel-defining first PDL in the thickness direction (e.g., an upper side in the third direction DR3). The protrusion SC may serve to maintain a distance with a structure disposed thereon. Although the present inventive concepts are not limited thereto, for example, the protrusion SC may prevent defects such as a dent from occurring on the display panel 10 by a fine metal mask (FMM). In an embodiment, like the pixel-defining film PDL, the protrusion SC may contain an organic insulating material. In an embodiment, the protrusion SC may be formed together with the pixel-defining film PDL by the same process. However, embodiments of the present inventive concepts are not limited thereto.

The protrusion SC may include a protrusion through-hole HLE2. The protrusion through-hole HLE2 may be defined by the protrusion SC. The protrusion through-hole HLE2 may pass through the protrusion SC in the thickness direction (e.g., the third direction DR3). The protrusion through-hole HLE2 may overlap (e.g., in the third direction DR3) the second pixel-defining film through-hole HLE1 of the pixel-defining film PDL and the via groove GR of the via layer VIA. The protrusion through-hole HLE2 may expose the via layer VIA thereunder together with the second pixel-defining film through-hole HLE1. As shown in the embodiment of FIG. 6, an inner wall of the protrusion SC defining the protrusion through-hole HLE2 may be aligned with the inner wall of the pixel-defining film PDL defining the second pixel-defining film through-hole HLE1. However, embodiments of the present inventive concepts are not limited thereto. The protrusion through-hole HLE2 may form a portion of the recess pattern RC. For example, the protrusion through-hole HLE2 may form an upper portion of the recess patter RC (e.g., in the third direction DR3). However, embodiments of the present inventive concepts are not limited thereto.

The emission layer EML is disposed on the anode ANO exposed by the pixel-defining film PDL (e.g., directly, thereon in the third direction DR3). In an embodiment, the emission layer EML may include an organic material layer. The organic material layer of the emission layer includes an organic emission layer, and may further include a hole injection/transport layer and/or an electron injection/transport layer. However, embodiments of the present inventive concepts are not limited thereto.

The cathode CAT may be disposed on the emission layer EML (e.g., directly thereon in the third direction DR3). The cathode CAT may be a common electrode disposed entirely without distinction of the pixels. The anode ANO, the emission layer EML, and the cathode CAT may each constitute an organic light-emitting device.

In an embodiment, the cathode CAT may include a material layer having a low work function such as Li, Ca, LiF/Ca, LiF/Al, Al, Mg, Ag, Pt, Pd, Ni, Au, Nd, Ir, Cr, BaF, Ba, or a compound or mixture thereof (e.g., a mixture of Ag and Mg, etc.). The cathode CAT may further include a transparent metal oxide layer disposed on the material layer having a low work function.

In an embodiment, the encapsulation film ENL including a first encapsulation film EN1, a second encapsulation film EN2, and a third encapsulation film EN3. However, embodiments of the present inventive concepts are not limited thereto and the number of the encapsulation films of the encapsulation film ENL may vary. The encapsulation film ENL is disposed on the cathode CAT (e.g., directly thereon in the third direction DR3). In an embodiment, the first encapsulation film EN1 and the third encapsulation film EN3 may be in direct contact with each other at an end portion of the encapsulation film ENL. The second encapsulation film EN2 may be sealed by the first encapsulation film EN1 and the third encapsulation film EN3.

The first encapsulation film EN1 and the third encapsulation film EN3 may each contain an inorganic material. For example, in an embodiment, the inorganic, material may include at least one compound selected from silicon nitride, silicon oxide, silicon oxynitride, or the like. However, embodiments of the present inventive concepts are not limited thereto. The second encapsulation film EN2 may contain an organic material. Although the present disclosure is not limited thereto, the organic material may include, for example, an organic insulating material.

The display panel 10 may further include at least one recess pattern RC. The recess pattern RC may be defined by the protrusion SC, the pixel-defining film PDL, and the via layer VIA. For example, in an embodiment, the recess pattern RC may be defined by removing at least a portion of the protrusion SC, the pixel-defining film PDL, and the via layer VIA. In this embodiment, the recess pattern RC passes through the protrusion SC and the pixel-defining film PDL in the thickness direction (e.g., in the third direction DR3), and may include a shape recessed from the first surface VIAa of the via layer VIA (e.g., an upper surface in the third direction DR3) toward the second surface VIAb of the via layer VIA (e.g., a lower surface in the third direction DR3).

For example, the recess pattern RC may be made of the protrusion through-hole HLE2 of the protrusion SC, the second pixel-defining film through-hole HLE1 of the pixel-defining film PDL, and the via groove GR of the via layer VIA. The recess pattern RC may be defined by the protrusion through-hole HLE2 of the protrusion SC, the second pixel-defining film through-hole HLE1 of the pixel-defining film PDL, and the via groove GR of the via layer VIA. In this embodiment, a side surface of the recess pattern RC may include the inner wall of the protrusion SC defining the protrusion through-hole HLE2, the inner wall of the pixel-defining film PDL defining the second pixel-defining film through-hole HLE1, and the inner wall GRb of the via groove GR of the via layer VIA. The bottom surface of the recess pattern RC may include the bottom surface GRa of the via groove GR of the via layer VIA.

In an embodiment, the recess pattern RC may not overlap a data line and a first power line on a plane. The recess pattern RC may be disposed between a plurality of data lines or between the data line and the first power line on a plane. However, embodiments of the present inventive concepts are not limited thereto, and the data line and the first power line may extend by bypassing a region in which the recess pattern RC is disposed on a plane.

As shown in the embodiment of FIG. 6, the cathode CAT, the first encapsulation film EN1, and the second encapsulation film EN2 may be disposed in the recess pattern RC. The cathode CAT may be disposed along a surface of the recess pattern RC. The cathode CAT may be disposed along the side and bottom surfaces of the recess pattern RC. For example, the cathode CAT may be disposed along the inner wall of the protrusion SC defining the protrusion through hole HLE2, the inner wall of the pixel-defining film PDL defining the second pixel-defining film through-hole HLE1, and the inner wall GRb and bottom surface of the via groove GR of the via layer VIA. As shown in the embodiment of FIG. 6, the cathode CAT may be in direct contact with the via layer VIA in the via groove GR of the via layer VIA. However, embodiments of the present inventive concepts are not limited thereto. For example, in an embodiment in which the emission layer EML is disposed inside the first pixel-defining film through-hole OP of the pixel-defining film PDL and over the entire area of the pixel-defining film PDL, the emission layer EML may be disposed in the recess pattern RC, and the emission layer EML may be in direct contact with the via layer VIA. Alternatively, the cathode CAT and the emission layer EML may not be disposed in at least a portion of the recess pattern RC. In this embodiment, the first encapsulation film EN1 may be in direct contact with at least one of the via layer VIA, the pixel-defining film PDL, and the protrusion SC.

As shown in the embodiment of FIG. 6, in the recess pattern RC, the first encapsulation film EN1 may be disposed on the cathode CAT (e.g., directly thereon), and the second encapsulation film EN2 may be disposed on the first encapsulation film EN1 (e.g., directly thereon). The second encapsulation film EN2 may fill an inner region of the recess pattern RC, such as a remaining portion of the protrusion through hole HLE2, the second pixel-defining film through-hole HLE1 and the via groove GR, that remains after the cathode CAT and the first encapsulation film EN1 are disposed. The inner region of the recess pattern RC may be defined by opposing sides of the first encapsulation film EN1 inside the recess pattern RC. As shows in the embodiment of FIG. 6, the respective thicknesses of the cathode electrode CAT and the first encapsulation film EN1 in the recess pattern RC may be substantially constant and the width of the inner region of the recess pattern RC formed between the opposing sides of the first encapsulation film EN1 may increase from a lower side of the recess pattern RC towards an upper side of the recess pattern RC. However, embodiments of the present inventive concepts are not limited thereto.

As shown in the embodiment of FIG. 6, the bottom surface of the recess pattern RC (e.g., the bottom surface GRa of the via groove GR) may be positioned at a lower position (e.g., a lower height) than the first surface VIAa of the via layer VIA (e.g., an upper surface in the third direction DR3) with respect to a first surface (e.g., an upper surface in the third direction DR3) or the second surface of the substrate SUB (e.g., a lower surface in the third direction DR3). For example, the bottom surface of the recess pattern RC (e.g., the bottom surface GRa of the via groove GR) may be positioned at a first height h1 with respect to a first surface or the second surface of the substrate SUB, and the first surface of the via layer VIAa (e.g., an upper surface in the third direction DR3) may be positioned at a second height h2 with respect to the first surface or the second surface of the substrate SUB. The second height h2 may be positioned at a level higher than the first height h1 with respect to the first surface or the second surface of the substrate SUB.

In an embodiment, the cathode CAT disposed in the recess pattern RC may be positioned at a height lower than the emission layer EML with respect to the first surface or the second surface of the substrate SUB. For example, since the anode ANO is disposed on the upper surface of the via layer VIA positioned at the second height h2, the emission layer EML is disposed on the anode ANO, and the cathode CAT disposed in the recess pattern RC is positioned at the first height h1. Therefore, the cathode CAT disposed in the recess pattern RC may be positioned at a height lower than the emission layer EML with respect to the first surface or the second surface of the substrate SUB.

As the recess pattern RC may be defined by removing at feast a portion of the protrusion SC, the pixel-defining film PDL, and the via layer VIA, adhesion of the encapsulation layer ENL may increase. For example, when the first encapsulation film EN1 and the second encapsulation film EN2 of the encapsulation layer EML are disposed in the recess pattern RC and the recess pattern RC is defined by the protrusion SC, the pixel-defining film PDL, and the via layer VIA, an area in which the first encapsulation film EN1 is disposed on the recess pattern RC may increase. That is, when the cathode CAT is disposed inside the recess pattern RC, a contact area between the first encapsulation film EN1 and the cathode CAT may be increased by the recess pattern RC.

In addition, when the display device 1 (see FIGS. 1 and 2) is folded, stress such as shear stress may be applied to the encapsulation layer ENL. However, when the recess pattern RC is defined by the protrusion SC, the pixel-defining film PDL, and the via layer VIA, and the first encapsulation film EN1 and the second encapsulation film EN2 are disposed inside the recess pattern RC, it is possible to suppress or prevent the first encapsulation film EN1 and the second encapsulation film EN2 from being peeled off from the recess pattern RC due to a depth (e.g., a depth in the thickness direction) of the recess pattern RC. Further, the adhesion of the encapsulation layer ENL may be increased. The adhesion of the encapsulation layer ENL may refer to adhesion between the first encapsulation film EN1 and the cathode CAT, and adhesion between the first encapsulation film EN1 and the second encapsulation film EN2.

Figure 7:
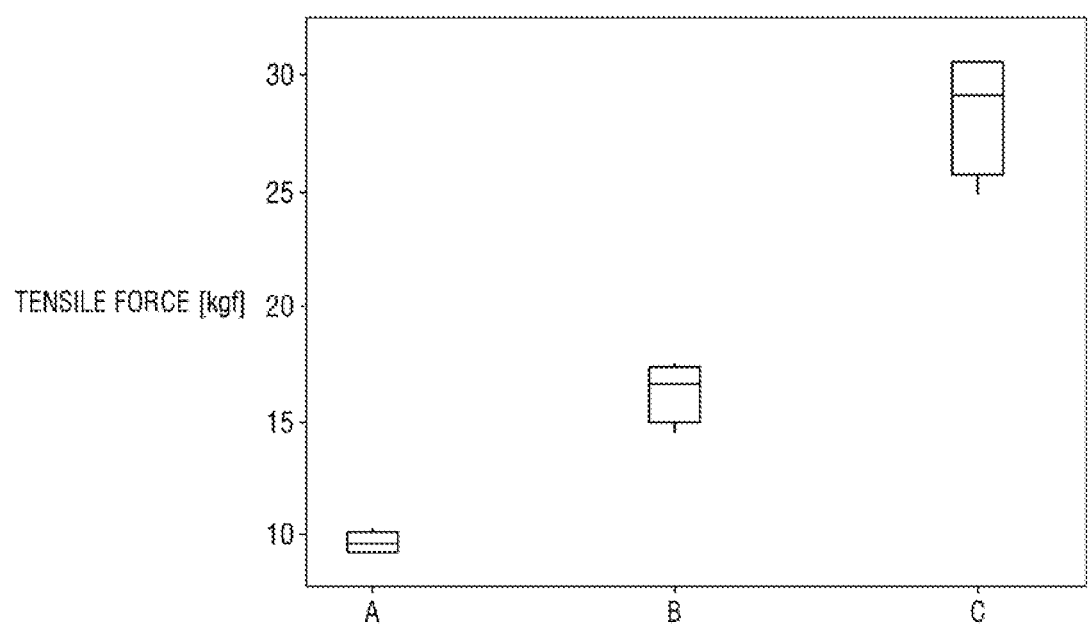
FIG. 7 is a graph obtained by measuring tensile force of an encapsulation layer according to the presence or absence of a recess pattern according to an embodiment of the present inventive concepts.

FIG. 7 is a graph obtained by measuring tensile force of an encapsulation layer according to the presence or absence of a recess pattern according to an embodiment.

Further referring to the embodiment of FIG. 7, an x-axis (a lateral axis) of FIG. 7 represents the presence/absence and number of recess patterns RC, and a y-axis (a longitudinal axis) represents tensile force (kgf) of the encapsulation layer ENL. Case A represents an embodiment in which the display panel 10 does not include the recess pattern RC, case B represents an embodiment in which the recess pattern RC is disposed in half of the pixels of the display panel 10, and case C represents an embodiment in which the recess pattern RC is disposed in all of the pixels of the display panel 10.

After the encapsulation layer ENL was formed on the cathode CAT, the force at the moment when the encapsulation layer ENL was pulled in an opposite direction in which the cathode CAT was positioned and peeled off was measured as the tensile force of the encapsulation layer ENL. In each case A, B, or C, the tensile force of the encapsulation layer ENL was measured four times.

In the case A of the graph, the minimum value of the tensile force of the encapsulation layer is about 7 kgf, the maximum value is about 11 kgf, and the average value is about 8 kgf. In the case B of the graph, the minimum value of the tensile force of the encapsulation layer is about 15.5 kgf, the maximum value is about 18 kgf, and the average value is about 17 kgf. In the case C of the graph, the minimum value of the tensile force of the encapsulation layer is about 26 kgf, the maximum value is about 31 kgf, and the average value is about 29 kgf.

The tensile force of the encapsulation layer ENL in the case B or C in which the display panel 10 includes the recess pattern RC may be greater than the tensile force of the encapsulation layer ENL in the case A in which the display panel 10 does not include the recess patter RC. In addition, as the number of recess patterns RC increases, the tensile force of the encapsulation layer ENL may increase. Therefore, as the display panel 10 includes the recess pattern RC, the adhesion of the encapsulation layer ENL may be increased. Further, mechanical stability of the display panel 10 and the display device 1 (see FIGS. 1 and 2) may be increased, and reliability may be increased.

Hereinafter, a method of manufacturing a display device according to an embodiment will be described.

FIGS. 8 to 11 are cross-sectional views for each process of the method of manufacturing the display device according to embodiments of the present inventive concepts.

Figure 8:
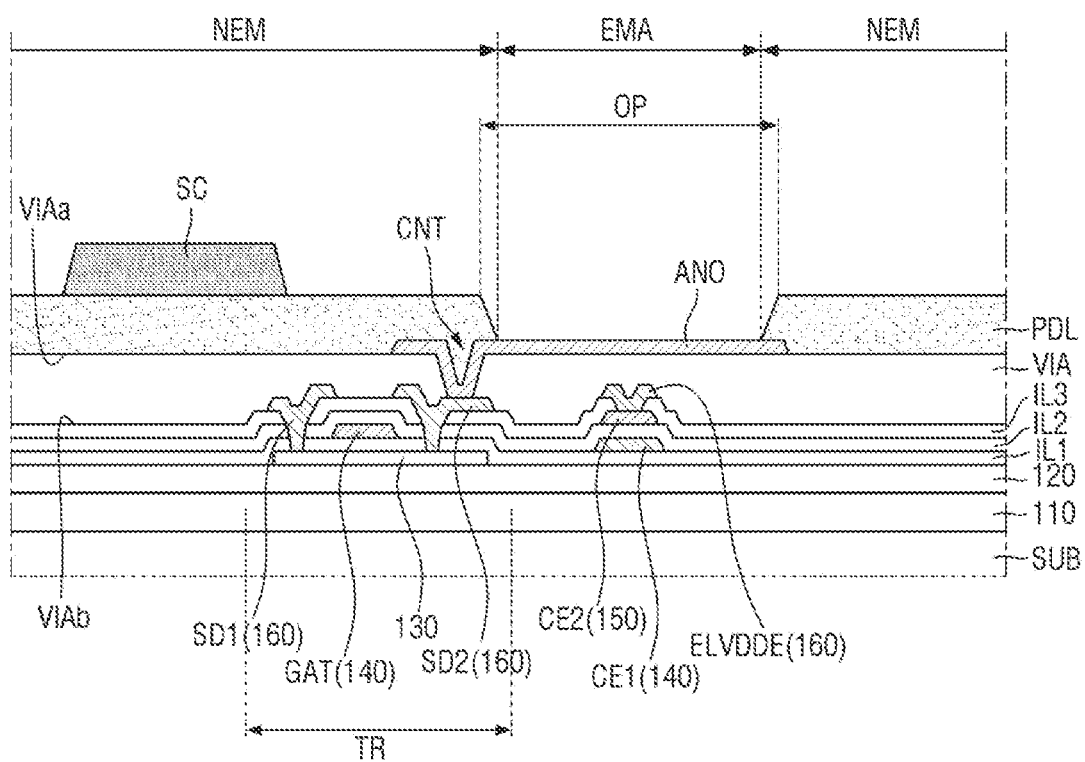
FIGS. 8 to 11 are cross-sectional views for each process of a method of manufacturing the display device according to embodiments of the present inventive concepts.

First, referring to the embodiment of FIG. 8, a substrate SUB on which a barrier layer 110 and a buffer layer 120 are disposed is prepared. A semiconductor layer 130, a first insulating layer IL1, a first gate conductive layer 140, a second insulating layer IL2, a second gate conductive layer 150, a third insulating layer IL3, a data conductive layer 160, a via layer VIA, an anode ANO, a pixel-defining film PDL, and a protrusion SC are then sequentially formed on the buffer layer 120.

In an embodiment, the semiconductor layer 130, the first gate conductive layer 140, the second gate conductive layer 150, the data conductive layer 160, and the anode ANO as shown in FIG. 8 may be formed by blanket-depositing each material layer, and then patterning through a photolithography process.

In an embodiment, the pixel-defining film PDL and the protrusion SC as shown in FIG. 8 may be formed by blanket-applying an organic material layer containing a photosensitive material, and then performing exposure and development. In an embodiment, the pixel-defining film PDL and the protrusion SC may be simultaneously formed using a half-tone mask. However, embodiments of the present inventive concepts are not limited thereto, and the pixel-defining film PDL and the protrusion SC may also be formed by different mask processes from each other.

The first insulating layer IL1, the second insulating layer IL2, the third insulating layer IL3, and the via layer VIA may cover configurations thereunder, and may be formed over the entire region of the substrate SUB.

Figure 9:
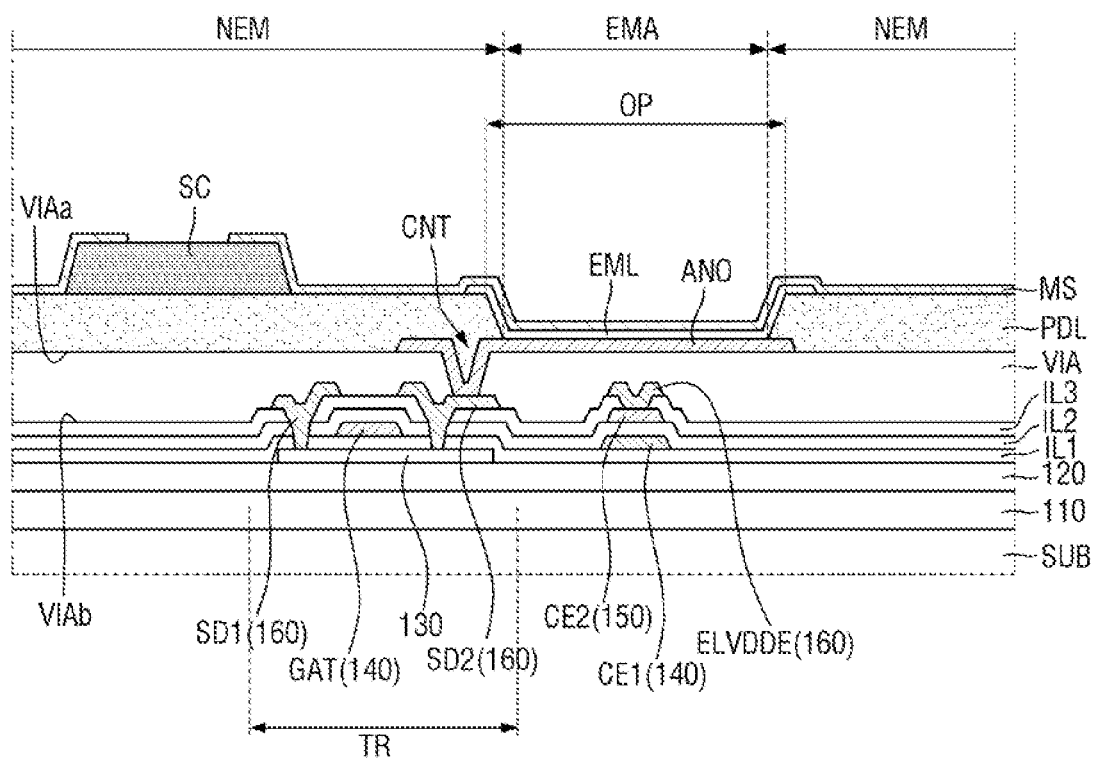

Referring to the embodiment of FIG. 9, a patterned mask pattern MS is then formed on the pixel-defining, film PDL and the protrusion SC.

For example, the mask pattern MS may expose one surface of the protrusion SC (e.g., a Portion of the upper surface of the protrusion SC). The mask pattern MS may be disposed on the anode ANO, the emission layer EML, as well as the pixel-defining film PDF and the protrusion SC. In other words, the mask pattern MS may cover the pixel-defining film PDL and the anode ANO, and may expose one surface of the protrusion SC.

In an embodiment, the mask pattern MS as shown in FIG. 9 may be formed by blanket-depositing a material layer for the mask pattern and then patterning the material layer through a photolithography process. The mask pattern MS may include at least one material selected from a transparent conductive oxide and an inorganic film. In an embodiment, the conductive oxide may include at least one compound selected from indium tin oxide (ITO) and indium zinc oxide (IZO), and the inorganic film may include aluminum (Al) or the like. However, embodiments of the present inventive concepts are not limited thereto. In an embodiment in which the mask pattern MS includes at least one compound selected from indium tin oxide (ITO) and indium zinc oxide (IZO), the indium tin oxide (ITO) and/or the indium zinc oxide (IZO) may be amorphous.

Figure 10:
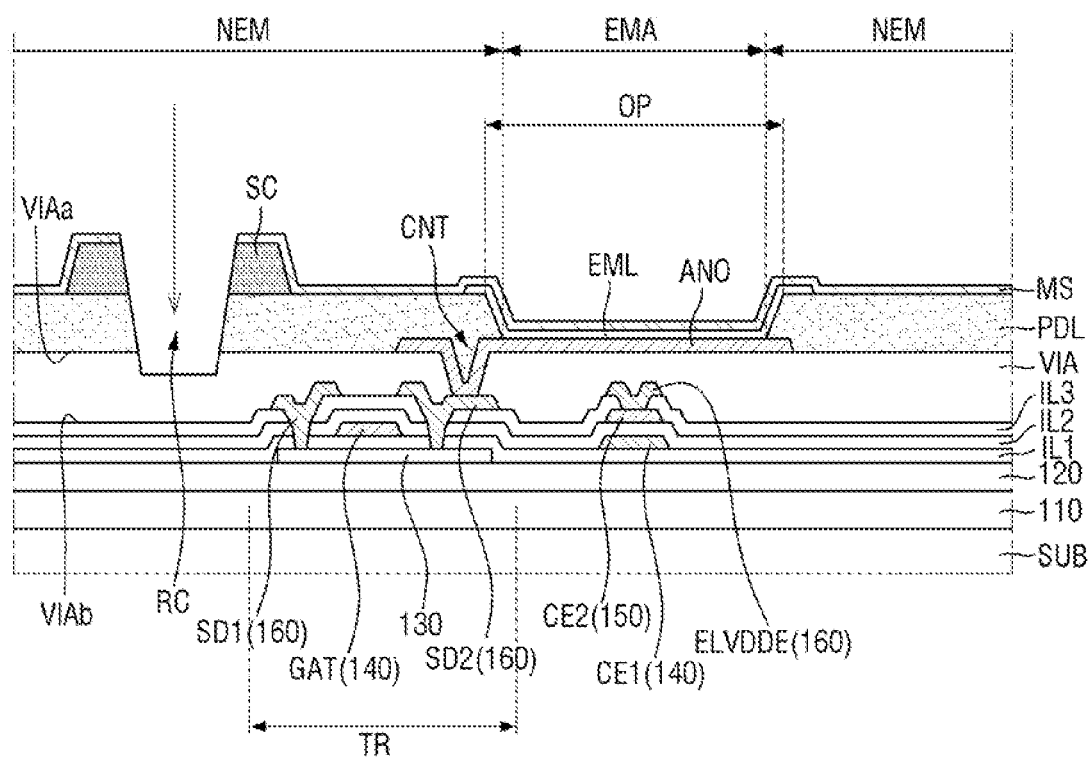

Referring to the embodiment of FIG. 10, a recess pattern RC is firmed using the mask patter MS as an etching mask.

For example, at least a portion of the protrusion SC, the pixel-defining film PDL, and the via layer VIA is etched using the mask pattern MS as an etching mask. Accordingly, the recess pattern RC may be formed. In an embodiment, the process of etching at least a portion of the protrusion SC, the pixel-defining film PDL, and the via layer VIA may be performed by dry etching. However, embodiments of the present inventive concepts are not limited thereto and the etching process may also be performed by wet etching or the like.

In the process of forming the recess pattern RC, a protrusion through-hole HLE2 (see FIG. 6) of the protrusion SC, a second pixel-defining film through-hole HLE1 (see FIG. 6) of the pixel-defining film PDL, and a via groove GR (see FIG. 6) of the via layer VIA may be formed.

In an embodiment in which the mask pattern MS including a transparent conductive oxide is used as an etching mask, even though a width of the recess pattern RC is relatively narrow and a depth in the thickness direction is large, the recess pattern RC may be formed more elaborately and smoothly. Therefore, it is possible to reduce a non-emission area NEM in which the recess pattern RC is disposed, so that more emission areas EMA ma be disposed on the substrate SUB having the same area, thereby realizing high resolution.

Figure 11:
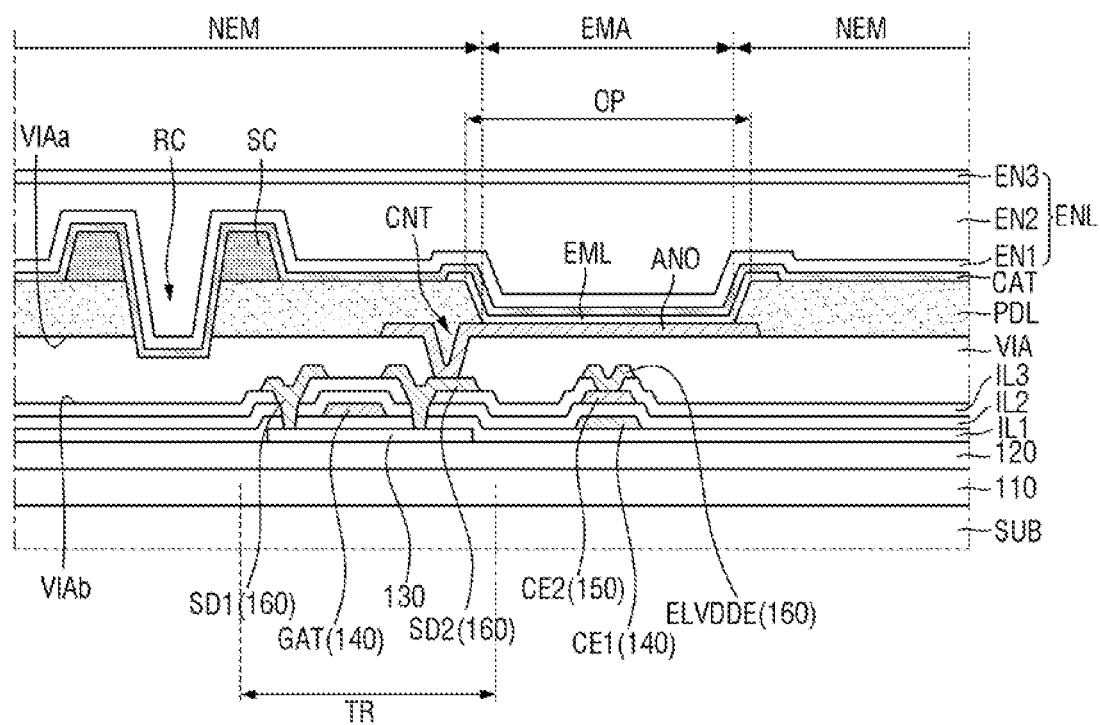

Referring to the embodiment of FIG. 11, an emission layer EML, a cathode CAT, and an encapsulation layer ENL are then sequentially formed.

For example, after removing the mask pattern MS, the emission layer EML is formed in a first pixel-defining film through-hole OP of the pixel-defining film PDL exposing the anode ANO. In an embodiment, a portion of the emission layer EML may be formed outside the first pixel-defining film through-hole OP of the pixel-defining film PDL. However, embodiments of the present inventive concepts are not limited thereto.

After the emission layer EML is formed, the cathode CAT is formed. The cathode CAT may be disposed on the emission layer EML, the pixel-defining film PDL, and the protrusion SC. In addition, the cathode CAT may be disposed in the recess pattern RC.

After the cathode CAT is formed, the encapsulation layer ENL is then formed on the cathode CAT. In an embodiment, a first encapsulation film EN1 is disposed on the cathode CAT, a second encapsulation film EN2 is disposed on the first encapsulation film EN1, and a third encapsulation film EN3 is disposed on the second encapsulation film EN2.

Hereinafter, embodiments will be described. In the following embodiments, the descriptions of the same components as those of the embodiments already described will be omitted or simplified, and differences will be mainly described for convenience of explanation.

Figure 12:
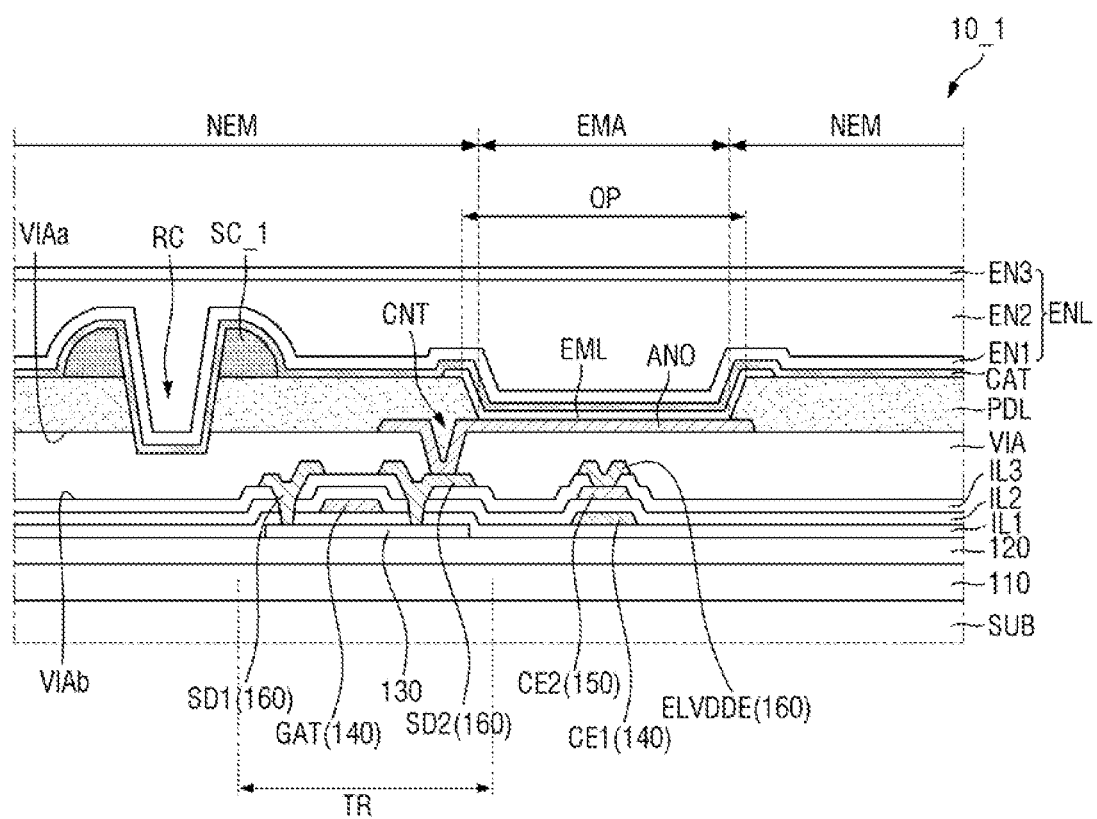
FIG. 12 is a cross-sectional view of a display panel according to an embodiment of the present inventive concepts.

FIG. 12 is a cross-sectional view of a display panel according to an embodiment.

Referring to the embodiment of FIG. 12, it is different from the embodiment of FIG. 5 in that at least a portion of a side surface of a protrusion SC_1 of a display panel 10_1 according to the present embodiment includes a round shape. In a region in which a recess pattern RC is disposed, the protrusion SC_1 including the protrusion through-bole HLE2 (see FIG. 6) may include a first surface (e.g., an upper surface in the third direction DR3), a second surface (e.g., a lower surface in the third direction DR3), and a side surface connected to the first surface and the second surface, and at least a portion of the side surface of the protrusion SC_1 may include a round shape. The side surface of the protrusion SC_1 may be a surface opposite to an inner wall of the protrusion SC_1 that defines the protrusion through-bole HLE2 (see FIG. 6). However, embodiments of the present inventive concepts are not limited thereto, and both the side surface and an upper surface of the protrusion SC_1 may have a round shape.

Even in this embodiment, adhesion of the encapsulation layer ENL may be increased by the recess pattern RC, and mechanical stability and reliability of the display panel 101 may be increased. In addition, as the side surface of the protrusion SC_1 includes the round shape, it is possible to suppress or prevent defects such as disconnection of the cathode CAT that may occur between the side surface of the protrusion SC_1 and one surface of the pixel-defining film PDL.

Figure 13:
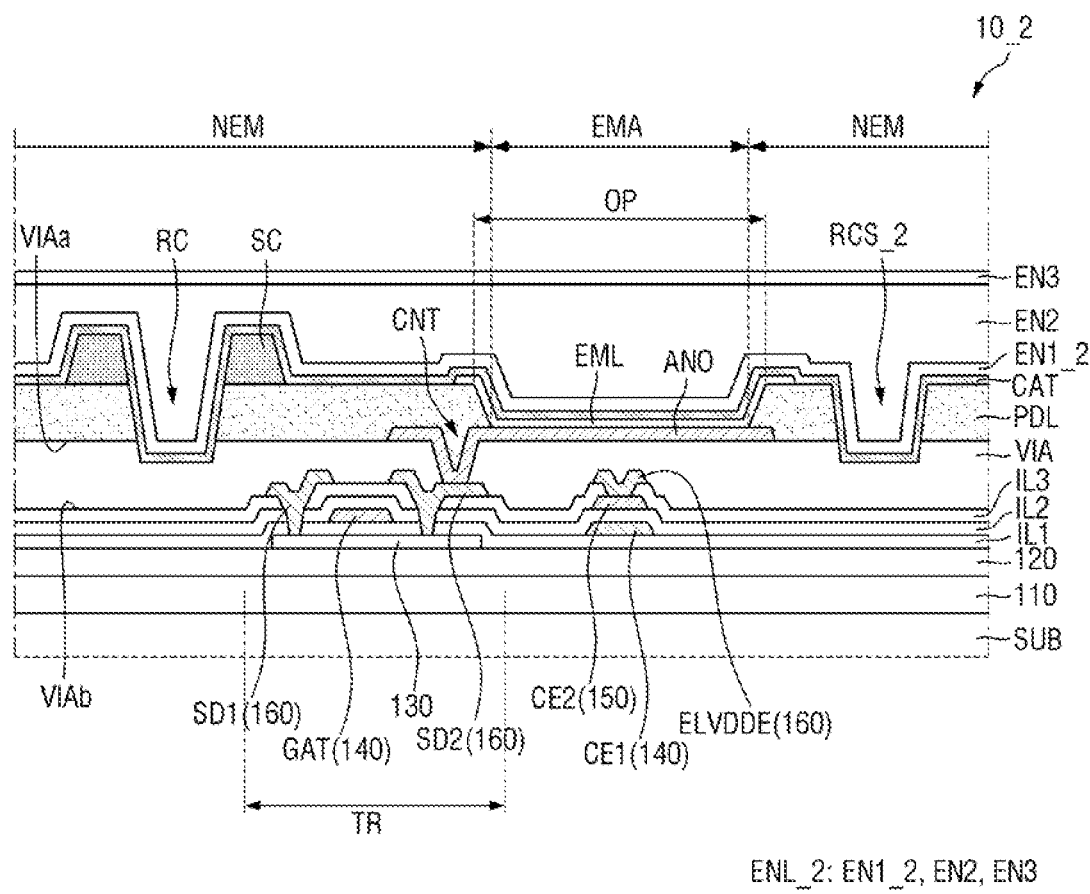
FIG. 13 is a cross-sectional view of a display panel according to an embodiment of the present inventive concepts.

FIG. 13 is a cross-sectional view of a display panel according, to an embodiment.

Referring to the embodiment of FIG. 13, it is different from the embodiment of FIG. 5 in that the display panel 10_2 further includes a sub-recess pattern RCS_2.

For example, the display panel 10_2 may further include the sub-recess pattern RCS_2. The sub-recess pattern RCS_2 may be disposed in a region in which the protrusion SC is not disposed. As shown in the embodiment of FIG. 13, the sub-recess pattern RCS_2 may be defined by the pixel-defining film PDL and the via layer VIA. For example, in an embodiment, the sub-recess pattern RCS_2 may be defined by removing at least a portion of the pixel-defining film PDL and the via layer VIA. In this embodiment, the sub-recess pattern RCS_2 may pass through the pixel-defining film PDL in the thickness direction, and may include a shape recessed from a first surface VIAa of the via layer VIA (e.g., an upper surface in the third direction DR3) toward the second surface VIAb of the via layer VIA (e.g., a lower surface in the third direction DR3).

The encapsulation layer ENL 2 shown in an embodiment of FIG. 13 includes a first encapsulation film EN1_2, a second encapsulation film EN2 and a third encapsulation film EN3, The cathode CAT, the first encapsulation film EN1_2, and the second encapsulation film EN2 may be disposed in the sub-recess pattern RCS_2. The cathode CAT may be disposed along the side surface and the bottom surface of the recess pattern RC. For example, the cathode CAT may be disposed directly on the side surface and the bottom surface of the recess pattern RC.

In an embodiment, a shape of the sub-recess pattern RCS_2 may be substantially the same as a shape of the recess pattern RC excluding the protrusion SC. In addition, in the embodiment of FIG. 13, the sub-recess pattern RCS_2 is included together with the recess pattern RC. However, embodiments of the present inventive concepts are not limited thereto, and the sub-recess pattern RCS_2 may be disposed by itself in at least one pixel without the recess pattern RC.

Even in this embodiment, adhesion of the encapsulation layer ENL may be creased by the recess pattern RC and the mechanical stability and reliability of the display panel 10_2 may be increased. In addition, as the sub-recess pattern RCS_2 is further disposed, the mechanical stability and reliability of the display panel 10_2 may be further increased.

Figure 14:
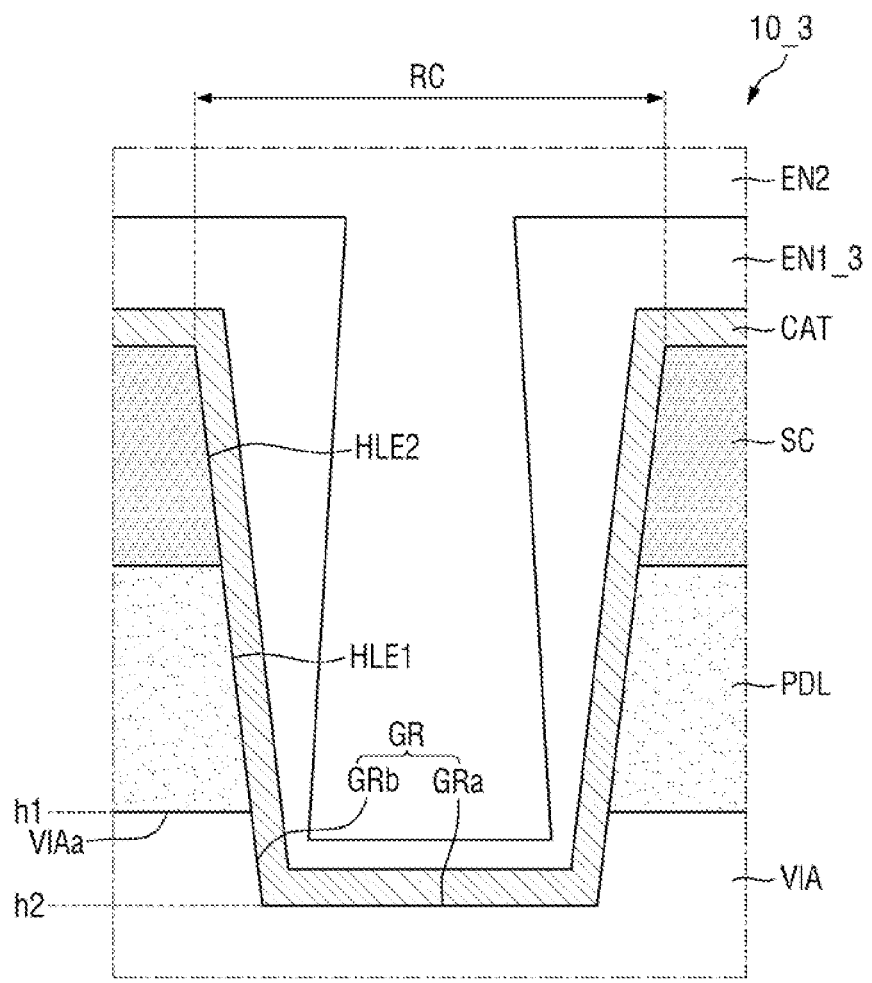
FIG. 14 is a cross-sectional view of a display panel according to an embodiment of the present inventive concepts.

FIG. 14 is a cross-sectional view of a display panel according to as embodiment. FIG. 14 is an enlarged view of a periphery of the recess pattern RC.

Referring to the embodiment of FIG. 14, it is different from the embodiment of FIG. 5 in that a thickness of a first encapsulation film EN1_3 of a display panel 10_3 according to the present embodiment is not constant.

For example, the thickness of the first encapsulation film EN1_3 disposed in the recess pattern RC may decrease from an upper side toward a lower side of the recess pattern RC. In other words, the thickness of the first encapsulation film EN1_3 may decrease from a first surface of the protrusion SC (e.g., an upper surface of the protrusion SC in the third direction DR3) toward the bottom surface GRa of the via groove GR of the via layer VIA. For example, the thickness of the first encapsulation film EN1_3 disposed on the inner wall of the protrusion SC defining the protrusion through-hole HLE2 may be larger than the thickness of the first encapsulation film EN1_3 disposed on the inner wall of the pixel-defining film PDL defining the second pixel-defining film through-hole HLE1 and the thickness of the first encapsulation film EN1_3 disposed on the via layer VIA defining the via groove GR. The thickness of the first encapsulation film EN1_3 disposed on the inner wall of the protrusion SC defining the protrusion through-hole HLE2 may decrease from an upper side toward a lower side thereof.

Here, the thickness of the first encapsulation film EN1_3 may refer to a width in a direction perpendicular to an extending direction of the first encapsulation film EN1_3. For example, in the first encapsulation film EN1_3 disposed along the side surface of the recess pattern RC, the thickness of the first encapsulation film EN1_3 may refer to a width in a direction perpendicular to the thickness direction (e.g., the third direction DR3), and may refer to a width in the left and right direction in FIG. 14.

In this embodiment, the first encapsulation film EN1_3 disposed in the recess pattern RC may include an under-cut shape. A distance between the first encapsulation films EN1_3 disposed on one side surface and the other side surface of the recess pattern RC facing each other may increase from the upper side toward the lower side of the recess pattern RC.

Even in this embodiment, adhesion of the encapsulation layer ENL may be increased by the recess pattern RC, mechanical stability and reliability of the display panel 10_3 may be increased. In addition, as the first encapsulation film EN1_3 includes the under-cut shape, adhesion between the first encapsulation film EN1_3 and the second encapsulation film EN2 may be increased, and the mechanical stability and reliability of the display panel 10_3 may be further increased.

In concluding the detailed description, those skilled in the art will appreciate that many variations and modifications can be made to embodiments described herein without substantially departing, from the principles of the present inventive concepts. Therefore, the disclosed embodiments of the present inventive concepts are used in a generic and descriptive sense only and not for purposes of limitation.

What is claimed is:

1. A display device comprising:
   a substrate;
   a via layer disposed on the substrate and including a via groove having a shape recessed from a first surface of the via layer towards a second surface of the via layer opposite to the first surface;
   a first electrode disposed on the first surface of the via layer;
   a pixel-defining film disposed on the via layer and the first electrode, the pixel-defining film including a first pixel-defining film through-hole passing through the pixel-defining film in a thickness direction and exposing a portion of the first electrode, and a second pixel-defining film through-hole passing through the pixel-defining film in the thickness direction, the second pixel-defining film through-hole is spaced apart from the first pixel-defining film through-hole, and overlaps the via groove;
   an emission layer disposed on the portion of the first electrode exposed by the pixel-defining film; and
   a protrusion disposed on the pixel-defining film and including a protrusion through-hole which passes through the protrusion in the thickness direction and overlaps the second pixel-defining film through-hole,
   wherein sidewalls of the via groove, sidewalls of the second pixel-defining film through-hole and sidewalls of the protrusion through-hole are aligned with each other to define a recess pattern having first and second opposing sidewalk, each of the first and second opposing sidewalls of the recess pattern extending continuously at a same angle from the via groove to an upper surface of the protrusion through-hole.

2. The display device of claim 1, further comprising a second electrode disposed on the emission layer,
   wherein the second electrode is disposed along the sidewalk of the protrusion through-hole, the sidewalls of the second pixel-defining film through-hole, and the sidewalls and a bottom surface of the via groove.

3. The display device of claim 2, wherein a portion of the second electrode disposed in the via groove is positioned at a first height, and the emission layer is positioned at a second height higher than the first height, based on an upper surface of the substrate.

4. The display device of claim 3, wherein the second electrode is in direct contact with the via layer.

5. The display device of claim 2, further comprising a first encapsulation layer disposed on the second electrode that is disposed along the sidewalls of the protrusion through-hole, the sidewalls of the second pixel-defining film through-hole, and the sidewalls and the bottom surface of the via groove.

6. The display device of claim 5, further comprising:
a second encapsulation layer disposed on the first encapsulation layer,
wherein the second encapsulation layer fills a remaining portion of the protrusion through-hole, the second pixel-defining film through-hole, and the via groove, that remains after the second electrode and the first encapsulation layer are disposed.

7. The display device of claim 6, further comprising:
a third encapsulation layer disposed on the second encapsulation layer,
wherein the first and third encapsulation layers contain an inorganic material, and the second encapsulation layer contains an organic material.

8. The display device of claim 5, wherein the first encapsulation layer includes an under-cut shape.

9. The display device of claim 1, further comprising:
an emission area emitting light and a non-emission area disposed around the emission area,
wherein the via groove, the second pixel-defining film through-hole, and the protrusion through-hole are disposed in the non-emission area.

10. The display device of claim 9, wherein the via groove, the second pixel-defining film through-hole, and the protrusion through-hole do not overlap the first electrode.

11. The display device of claim 1, wherein at least a portion of a first side surface of the protrusion that is opposite to the sidewalls of the protrusion has a round shape.

12. A display device comprising:
a substrate;
a via layer disposed on the substrate and including a via groove having a shape recessed from a first surface of the via layer towards a second surface of the via layer opposite to the first surface;
a first electrode disposed on the first surface of the via layer;
a pixel-defining film disposed on the via layer and the first electrode, the pixel-defining film including a first pixel-defining film through-hole passing through the pixel-defining film in a thickness direction and exposing a portion of the first electrode, and a second pixel-defining film through-hole passing through the pixel-defining film in the thickness direction, the second pixel-defining film through-hole is spaced apart from the first pixel-defining film through-hole, and overlaps the via groove;
an emission layer disposed on the portion of the first electrode exposed by the pixel-defining film;
a protrusion disposed on the pixel-defining film and including a protrusion through-hole which passes through the protrusion in the thickness direction and overlaps the second pixel-defining film through-hole,
a second electrode disposed on the pixel-defining film and the emission layer; and
a first encapsulation layer disposed on the second electrode,
wherein the second electrode and the first encapsulation layer are disposed along sidewalls of the second pixel-defining film through-hole and sidewalls and a bottom surface of the via groove,
wherein the sidewalls of the via groove, the sidewalls of the second pixel-defining film through-hole and sidewalls of the protrusion through-hole are aligned with each other to define a recess pattern having first and second opposing sidewalls, each of the first and second opposing sidewalls of the recess pattern extending continuously at a same angle from the via groove to an upper surface of the protrusion through-hole.

13. The display device of claim 12, further comprising:
a second encapsulation layer disposed on the first encapsulation layer and a third encapsulation layer disposed on the second encapsulation layer,
wherein the second encapsulation layer fills a remaining portion of the second pixel-defining film through-hole and the via groove, that remains after the second electrode and the first encapsulation layer are disposed, and
wherein the first and third encapsulation layers contain an inorganic material, and the second encapsulation layer contains an organic material.

14. The display device of claim 13, wherein the first encapsulation layer includes an under-cut shape.

15. The display device of claim 12,
wherein the second electrode and the first encapsulation layer are disposed along the sidewalls of the protrusion through-hole.

16. The display device of claim 15, wherein a portion of the second electrode disposed in the via groove is positioned at a first height, and the emission layer is positioned at a second height higher than the first height, based on an upper surface of the substrate.

17. The display device of claim 16, wherein the second electrode is in direct contact with the via layer.

18. A method of manufacturing a display device, comprising:
preparing a substrate including a via layer, a first electrode disposed on the via layer, a pixel-defining film disposed on the via layer and the first electrode, and a protrusion disposed on the pixel-defining film;
disposing a mask pattern on the substrate, the mask pattern exposing a portion of the protrusion; and
etching the protrusion, the pixel-defining film, and the via layer through the mask pattern,
wherein after the etching, the via layer includes a via groove having a shape recessed from a first surface of the via layer towards to a second surface of the via layer opposite to the first surface, the pixel-defining film includes a second pixel-defining film through-hole passing through the pixel-defining film in a thickness direction, and the protrusion includes a protrusion through-hole passing through the protrusion in the thickness direction, and
wherein the via groove, the second pixel-defining film through-hole, and the protrusion through-hole overlap each other.

* * * * *